United States Patent
Shibuya

(10) Patent No.: US 9,291,783 B2
(45) Date of Patent: Mar. 22, 2016

(54) OPTICAL RECEPTACLE AND OPTICAL MODULE PROVIDED WITH SAME

(75) Inventor: Kazutaka Shibuya, Kawaguchi (JP)

(73) Assignee: ENPLAS CORPORATION, Kawaguchi-Shi (JP)

(*) Notice: Subject to any disclaimer, the term of this patent is extended or adjusted under 35 U.S.C. 154(b) by 0 days.

(21) Appl. No.: 14/122,232

(22) PCT Filed: Jun. 7, 2012

(86) PCT No.: PCT/JP2012/064685
§ 371 (c)(1),
(2), (4) Date: Nov. 25, 2013

(87) PCT Pub. No.: WO2012/169586
PCT Pub. Date: Dec. 3, 2012

(65) Prior Publication Data
US 2014/0086536 A1    Mar. 27, 2014

(30) Foreign Application Priority Data

Jun. 7, 2011   (JP) .................................. 2011-127181

(51) Int. Cl.
*G02B 6/42*       (2006.01)
*H01L 31/0232*    (2014.01)
*H01L 27/146*     (2006.01)

(52) U.S. Cl.
CPC ........ *G02B 6/4207* (2013.01); *H01L 27/14618* (2013.01); *H01L 27/14625* (2013.01); *H01L 31/02325* (2013.01); *G02B 6/4206* (2013.01); *H01L 2924/0002* (2013.01)

(58) Field of Classification Search
CPC ............... G02B 6/4207; G02B 6/4206; H01L 27/14627; H01L 31/02325; H01L 33/56

USPC ...................................................... 385/88–94
See application file for complete search history.

(56) References Cited

U.S. PATENT DOCUMENTS 5,526,455 A * 6/1996 Akita et al. ..................... 385/93
5,692,083 A * 11/1997 Bennett ......................... 385/88
5,937,122 A * 8/1999 Ohki et al. ..................... 385/78
(Continued)

FOREIGN PATENT DOCUMENTS

JP    1981-113305 U1    9/1981
JP    S60-138506 A      7/1985
(Continued)

OTHER PUBLICATIONS

International Search Report (ISR) mailed Jul. 31, 2012, issued for International application No. PCT/JP2012/064685.

*Primary Examiner* — Daniel Petkovsek
(74) *Attorney, Agent, or Firm* — Law Office of Katsuhiro Arai

(57) ABSTRACT

An optical fiber attaching section, a photoelectric conversion device attaching section, and a lens are integrally formed by a light-transmitting resin material. The optical fiber attaching section is formed concentrically with an optical axis OA of the lens. A contact surface for the photoelectric conversion device in the photoelectric conversion device attaching section is formed having a tilt in relation to a plane that is perpendicular to the optical axis OA. As the photoelectric conversion device, a photoelectric conversion device is attached in which a contact surface for the photoelectric conversion device attaching section is formed in parallel with a light-receiving surface of a light-receiving element.

9 Claims, 8 Drawing Sheets

(56) References Cited

U.S. PATENT DOCUMENTS

| | | | |
|---|---|---|---|
| 6,536,959 B2 * | 3/2003 | Kuhn et al. | 385/93 |
| 6,607,309 B2 * | 8/2003 | Kuhn et al. | 385/93 |
| 6,942,398 B2 * | 9/2005 | Morioka | 385/93 |
| 7,083,337 B2 * | 8/2006 | Farr et al. | 385/93 |
| 7,101,089 B2 * | 9/2006 | Sohmura et al. | 385/88 |
| 7,348,540 B2 * | 3/2008 | Mogi et al. | 250/227.11 |
| 7,604,419 B2 * | 10/2009 | Morioka | 385/93 |
| 8,142,082 B2 * | 3/2012 | Oshima et al. | 385/88 |
| 2004/0184743 A1 | 9/2004 | Morioka | |
| 2005/0018981 A1 * | 1/2005 | Modavis et al. | 385/93 |
| 2006/0104577 A1 | 5/2006 | Morioka | |
| 2009/0263087 A1 | 10/2009 | Oshima et al. | |

FOREIGN PATENT DOCUMENTS

| | | |
|---|---|---|
| JP | 1993-055563 U | 7/1993 |
| JP | 2004-239997 A | 8/2004 |
| JP | 2008-083282 A | 4/2008 |
| JP | 2009-258365 A | 11/2009 |

* cited by examiner

US 9,291,783 B2

OPTICAL RECEPTACLE AND OPTICAL MODULE PROVIDED WITH SAME

This application is the U.S. National Phase under 35 U.S.C. §371 of International Application PCT/JP2012/064685, filed Jun. 7, 2012, which claims priority to Japanese Patent Application No. 2011-127181, filed Jun. 7, 2011. The International Application was published under PCT Article 21(2) in a language other than English.

TECHNICAL FIELD

The present invention relates to an optical receptacle and an optical module including the optical receptacle. In particular, the present invention relates to an optical receptacle suitable for optically coupling an end portion of an optical fiber and a light-receiving element of a photoelectric conversion device, and an optical module including the optical receptacle.

BACKGROUND ART

Since the past, an optical module component referred to as an optical receptacle has been used in optical communication using optical fibers. The optical receptacle is configured such that an end portion of an optical fiber held within a cylindrical ferrule is inserted into the optical receptacle together with the ferrule and fixed thereto. In addition, a photoelectric conversion device having a photoelectric conversion element is attached to the optical receptacle. The optical receptacle onto which the photoelectric conversion device and the optical fiber are assembled in this way optically couples the photoelectric conversion element and the end portion of the optical fiber.

Here, FIG. 10 shows an example of this type of optical receptacle 1. The optical receptacle 1 is integrally formed by injection molding of a light-transmitting resin material, such as polyetherimide (PEI), polycarbonate (PC), polyethersulfone (PES), cyclo olefin polymer (COP), or poly(methyl methacrylate) (PMMA).

As shown in FIG. 10, the optical receptacle 1 has a lens 2 in a substantially center position in a length direction. The lens 2 is formed into a plano-convex lens in which a face 2a in one optical axis OA direction of the lens 2 (downward in FIG. 10) is a convex face, and a face 2b in the other direction (upward in FIG. 10) is a planar face.

In addition, as shown in FIG. 10, the optical receptacle 1 has a photoelectric conversion device attaching section 3 that extends from an outer position in a radial direction of the lens 2 towards one optical axis OA direction (downward in FIG. 10). The photoelectric conversion device attaching section 3 is formed into a cylindrical shape of which an inner circumferential surface is a circular cylindrical shape that is concentric with the optical axis OA. However, as shown in FIG. 10, a through-hole 4 is bored into the photoelectric conversion device attaching section 3 to allow gas, generated from an adhesive (such as a thermoset resin) when the photoelectric conversion device is fixed to the photoelectric conversion device attaching section 3 using the adhesive, to escape outside.

Furthermore, as shown in FIG. 10, the optical receptacle 1 has an optical fiber attaching section 5 that extends from the outer position in the radial direction of the lens 2 towards a direction in the optical axis OA direction opposite to the photoelectric conversion device attaching section 3. The optical fiber attaching section 5 is formed into a cylindrical shape of which an inner circumferential surface is a substantially circular cylindrical shape that is concentric with the optical axis OA.

Next, FIG. 11 shows an optical module 7 for reception as an example of an optical module including the optical receptacle 1, such as that described above.

In other words, as shown in FIG. 11, in the optical module 7, a CAN-package-type photoelectric conversion device 8 including an optical reception function is attached to the photoelectric conversion device attaching section 3 of the optical receptacle 1. More specifically, as shown in FIG. 11, the photoelectric conversion device 8 is configured by: a circular disk-shaped stem 9; a light-receiving element 10, such as a photodetector (PD), mounted on the stem 9; a cap 11 having a window portion in a top portion and disposed such as to cover the light-receiving element 10; and a lead 12 through which electrical signals flow based on a light-reception result (photoelectric conversion) of the light-receiving element 10.

In addition, as shown in FIG. 11, in the optical module 7, an optical fiber 15 is detachably attached to the optical fiber attaching section 5 together with a ferrule that holds the optical fiber 15.

In the optical module 7 for reception such as that described above, light including transmission information that has been transmitted from a transmission-side device (such as a semiconductor laser LD) is transmitted over the optical fiber 15 and emitted from an end portion (end face) 15a of the optical fiber 15 towards the lens 2. The light emitted towards the lens 2 is converged by the lens 2 and emitted towards the photoelectric conversion device 8. Thereafter, the light is received by the light-receiving element 10 of the photoelectric conversion device 8. In this way, the end portion 15a of the optical fiber 15 and the light-receiving element 10 are optically coupled.

In the optical module 7 for reception such as that described above, a light-receiving surface of the light-receiving element 10 is formed by silicone or the like. Therefore, as shown in FIG. 12, as a result of the light emitted from the end face 15a of the optical fiber 15 (broken line in FIG. 12) being reflected by the light-receiving surface of the light-receiving element 10, a problem occurs in that the light returns to (enters) the end portion 15a of the optical fiber 15 as optical feedback (double-dotted dashed line in FIG. 12). In particular, in an instance in which a single-mode-type optical fiber 15 is used, such optical feedback may adversely affect the optical output characteristics of the transmission-side device as noise.

To reduce such problems, for example, as shown in FIG. 13, controlling the reflection direction of the light at the light-receiving surface of the light-receiving element 10 to a direction allowing incidence (amount of incident light) of the reflected light onto the end portion 15a of the optical fiber 15 to be suppressed (a direction deliberately shifted from the end portion 15a) by the photoelectric conversion device 8 being attached to the photoelectric conversion device attaching section 3 in a state that is tilted in relation to the optical axis OA of the lens 2 can be considered.

In addition, since the past, various proposals have been made to reduce the problem of optical feedback.

For example, in Patent Literature 1, a proposal is made in which a photoelectric conversion device mounted with a PD chip at an angle is used, thereby suppressing the reflected light from the PD chip from turning into optical feedback.

In addition, in Patent Literature 2, a proposal is made in which the end portion of the optical fiber is attached in a state in which the optical axis of the end portion is tilted in relation to the optical axis of the lens, thereby suppressing the reflected light of the PD from turning into optical feedback after passing through the lens.

Patent Literature 1: Japanese Patent Laid-open Publication No. 2009-258365

Patent Literature 1: Japanese Patent Laid-open Publication No. 2008-83282

DISCLOSURE OF INVENTION

Problem to be Solved by the Invention

However, in the configuration shown in FIG. 13, a contact surface for the photoelectric conversion device attaching section 3 in the photoelectric conversion device 8 (upper surface of the stem 9 in FIG. 13) is in a state that is tilted in relation to a contact surface (lower end surface 3a in FIG. 13) for the photoelectric conversion device 8 in the photoelectric conversion device attaching section 3. Therefore, the photoelectric conversion device 8 cannot be placed in stable contact with the photoelectric conversion device attaching section 3 by an adhesive 18. Accurate centering operation (operation for positioning the center point of the light-receiving surface of the light-receiving element 10 on the optical axis OA of the lens 2; the same applies hereafter) also becomes difficult. In other words, the configuration in FIG. 13 has a problem in that attachment of the photoelectric conversion device 8 cannot be performed easily and with high accuracy.

In addition, the configuration described in Patent Literature 1 requires use of a special photoelectric conversion device in which the PD chip is tilted (customized product), and has a problem in that cost increases.

Furthermore, the configuration described in Patent Literature 2 requires the optical receptacle to be manufactured such that a section holding the optical fiber and a section holding the lens and the photoelectric conversion device are separately manufactured, because the optical fiber is required to be held at an angle. This is because, even should both sections be integrally molded using a mold, because the section that holds the optical fiber is titled, a mold design for ensuring mold release becomes extremely difficult. In other words, the configuration described in Patent Literature 2 has a problem in that the optical receptacle cannot be easily manufactured at low cost. Furthermore, in addition to the above, the configuration described in Patent Literature 2 has a problem in terms of optical performance in that, due to the configuration in which the optical fiber is held at an angle, coupling efficiency of the optical fiber to the light-receiving element may change significantly as a result of dimensional change (linear expansion) in the optical receptacle accompanying temperature change.

Therefore, the present invention has been achieved in light of the above-described issues. An object of the present invention is to provide an optical receptacle that is capable of effectively reducing optical feedback, ensuring optical performance, and achieving increased manufacturing efficiency and reduced cost, and an optical module including the optical receptacle.

Means for Solving Problem

To achieve the above-described object, an optical receptacle according to a first aspect is an optical receptacle including: a cylindrical optical fiber attaching section for attaching an end portion of an optical fiber; a cylindrical photoelectric conversion device attaching section for attaching, in a state of contact, a photoelectric conversion device having a light-receiving element; a lens for optically coupling the end portion of the optical fiber and the light-receiving element. In the optical receptacle, the optical fiber attaching section, the photoelectric conversion device attaching section, and the lens are integrally formed by a light-transmitting resin material. The optical fiber attaching section is formed concentrically with an optical axis of the lens. A contact surface for the photoelectric conversion device in the photoelectric conversion device attaching section is formed having a tilt in relation to a plane that is perpendicular to the optical axis of the lens. As the photoelectric conversion device, a photoelectric conversion device is attached in which a contact surface for the photoelectric conversion device attaching section is formed in parallel with a light-receiving surface of the light-receiving element.

In the invention according to the first aspect, the contact surface for the photoelectric conversion device in the photoelectric conversion device attaching section is formed having a tilt in relation to a plane that is perpendicular to the optical axis of the lens. Therefore, reflected light on the light-receiving surface of the light-receiving element can be effectively prevented from turning into optical feedback, while using a general-purpose photoelectric conversion device. In addition, because the photoelectric conversion device attaching section is concentric with the optical axis of the lens, integrated molding using a resin material can be performed without difficulty and stability of optical performance against temperature change can be ensured. Furthermore, the photoelectric conversion device can be easily attached with high accuracy as a result of the contact surface in the photoelectric conversion device attaching section and the contact surface in the photoelectric conversion device being placed in stable contact.

In addition, an optical receptacle according to a second aspect is the optical receptacle according to the first aspect in which, further, the contact surface for the photoelectric conversion device in the photoelectric conversion device attaching section is an end surface of the photoelectric conversion device attaching section on the photoelectric conversion device side.

In the invention according to the second aspect, attachment of a photoelectric conversion device having a larger outer circumference than the photoelectric conversion device attaching section can be appropriately supported.

In addition, an optical receptacle according to a third aspect is the optical receptacle according to the first aspect in which, further, the contact surface for the photoelectric conversion device in the photoelectric conversion device attaching section is a recessing surface that recesses towards the lens side in relation to the end surface of the photoelectric conversion device attaching section on the photoelectric conversion device side, in a position further inward in a radial direction than the end surface.

In the invention according to the third aspect, attachment of a photoelectric conversion device having a smaller outer circumference than the photoelectric conversion device attaching section can be appropriately supported.

Still further, an optical module according to a fourth aspect includes: an optical receptacle according to any one of embodiments 1 to 3; an optical fiber according to embodiment 1; and a photoelectric conversion device according to embodiment 1.

In the invention according to the fourth aspect, reflected light on the light-receiving surface of the light-receiving element can be effectively prevented from turning into optical feedback, while using a general-purpose photoelectric conversion device. In addition, integrated molding using a resin material can be performed without difficulty and stability of optical performance against temperature change can be ensured. Furthermore, the photoelectric conversion device can be easily attached with high accuracy.

An optical module according to a fifth aspect is the optical module according to the fourth aspect in which the optical fiber is a single-mode optical fiber.

In the invention according to the fifth aspect, compared to an instance in which a multi-mode optical fiber is used, the effect of optical feedback reduction is significant.

Effect of the Invention

In the present invention, optical feedback can be effectively reduced, optical performance can be ensured, and increased manufacturing efficiency and reduced cost can be achieved.

BEST MODE(S) FOR CARRYING OUT THE INVENTION

First Embodiment

A first embodiment of the present invention will hereinafter be described with reference to FIG. 1 and FIG. 2.

However, sections of which the basic configuration is the same or similar to that of the conventional configuration are described using the same reference numbers.

Figure 1:
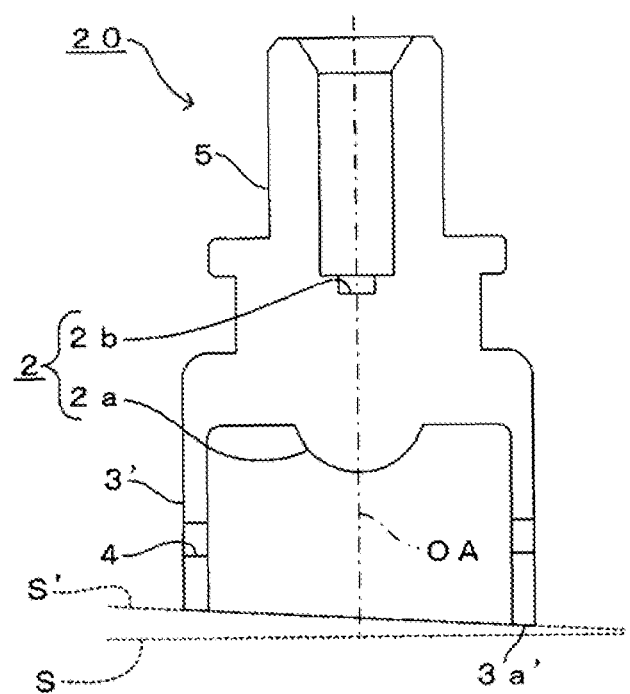
FIG. 1 is a vertical cross-sectional view of an optical receptacle according to a first embodiment of the present invention.

As shown in FIG. 1, in a manner similar to the conventional optical receptacle 1, an optical receptacle 20 according to the present embodiment is configured by the lens 2, the photoelectric conversion device attaching section 3, and the optical fiber attaching section 5 being integrally formed using a light-transmitting resin material. In addition, unlike the configuration described in Patent Literature 2, the optical receptacle 20 according to the present embodiment can be integrally formed using a mold without difficulty because the optical fiber attaching section 5 is formed concentrically with the optical axis OA of the lens 2. As the mold, for example, an injection molding mold may be used that includes: an upper mold (such as a movable mold) in which shape transfer surfaces of an inner circumferential surface and an upper end surface of the optical fiber attaching section 5 and the planar face 2b of the lens are formed; a lower mold (such as a fixed mold) in which the shape transfer surfaces of an inner circumferential surface and a lower end surface of the photoelectric conversion device attaching section 3 and the convex face 2a of the lens 2 are formed; and a split mold in which the shape transfer surface of an outer circumferential surface of the optical receptacle 20 is formed and that has a parting line on a virtual plane including the optical axis OA. In this instance, the split mold may be that configured by a left-side slide mold for forming the left half section in FIG. 1 of the outer circumferential surface of the optical receptacle 20, a right-side slide mold for forming the right half section in FIG. 1 of the outer circumferential surface of the optical receptacle 20, and a pin for forming the through-hole 4 included in each slide mold.

Figure 10:
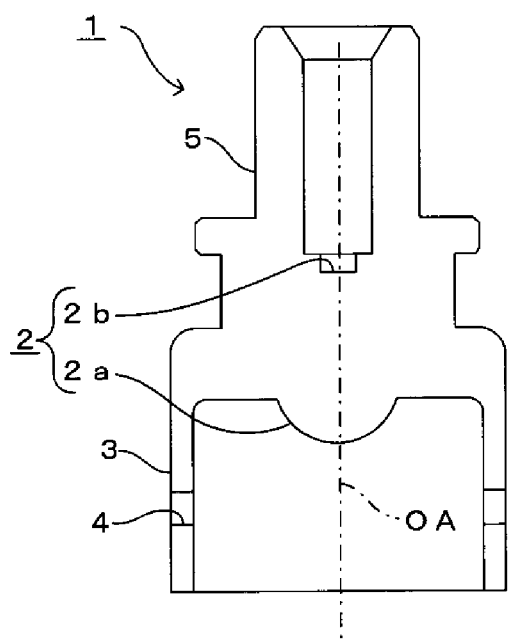
FIG. 10 is a vertical cross-sectional view of a configuration example of a conventional optical receptacle.

In the conventional configuration shown in FIG. 10, the lower end surface 3a that is the contact surface for the photoelectric conversion device 8 in the photoelectric conversion device attaching section 3 is formed to be parallel with a virtual plane that is perpendicular to the optical axis OA of the lens 2. However, the optical receptacle 20 according to the present embodiment differs from such conventional configuration.

In other words, as shown in FIG. 1, according to the present embodiment, a lower end surface 3a' of a photoelectric conversion device attaching section 3' as the contact surface for the photoelectric conversion device 8 in the photoelectric conversion device attaching section 3' is formed having a tilt in relation to a virtual plane S that is perpendicular to the optical axis OA of the lens 2. More specifically, the lower end surface 3a' of the photoelectric conversion device attaching section 3' has a bracelet-shape that surrounds the optical axis OA and is disposed, over the overall circumference, on a single virtual plane S' (on the same plane) having a predetermined slope angle in relation to the virtual plane S perpendicular to the optical axis OA of the lens 2.

Figure 2:
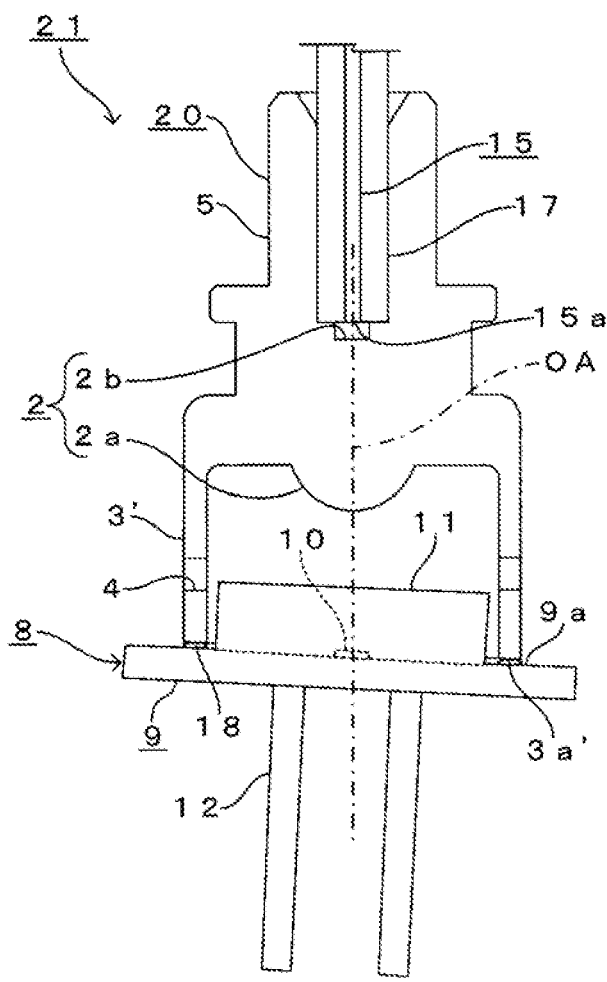
FIG. 2 is a vertical cross-sectional view of an optical module according to the first embodiment of the present invention.

As shown in FIG. 2, the optical receptacle 20 according to the present embodiment such as this configures an optical module 21 according to the present embodiment by attachment of the optical fiber 15 to the optical fiber attaching section 5 and attachment of the photoelectric conversion device to the photoelectric conversion device attaching section 3' being performed.

The photoelectric conversion device 8 is that in which an upper end surface 9a of the stem 9 as a contact surface for the photoelectric conversion device attaching section 3' is in parallel with the light-receiving surface (upper end surface) of the light-receiving element 10. Unlike the configuration described in Patent Literature 1, the photoelectric conversion device 8 such as this can be obtained at a relatively low cost as a general-purpose product (existing product). Attachment of the photoelectric conversion device 8 is specifically performed by the light-receiving element 10 and the cap 11 of the photoelectric conversion device 8 being inserted into a space surrounded by the photoelectric conversion device attaching section 3', thereby placing the contact surface 9a in the photoelectric conversion device 8 and the contact surface 3a' in the photoelectric conversion device attaching section 3' in contact with the adhesive 18 (such as a thermoset resin) therebetween. After the above-described centering operation, the adhesive 18 is hardened (such as by thermosetting).

As shown in FIG. 2, in the optical module 21 according to the present embodiment, the light-receiving surface of the light-receiving element 10 has a predetermined tilt and does not directly face the convex face 2a of the lens 2. Therefore, even should the light emitted from the lens 2 towards the light-receiving element 10 (light transmitted by the optical fiber 15 from the transmission side) be reflected at the light-receiving surface, the reflection direction of the reflected light is controlled to a direction that can deliberately suppress incidence of the reflected light onto the end portion 15a of the optical fiber 15. As a result, the reflected light at the light-receiving surface of the light-receiving element 10 turning into optical feedback can be effectively suppressed.

Figure 3:
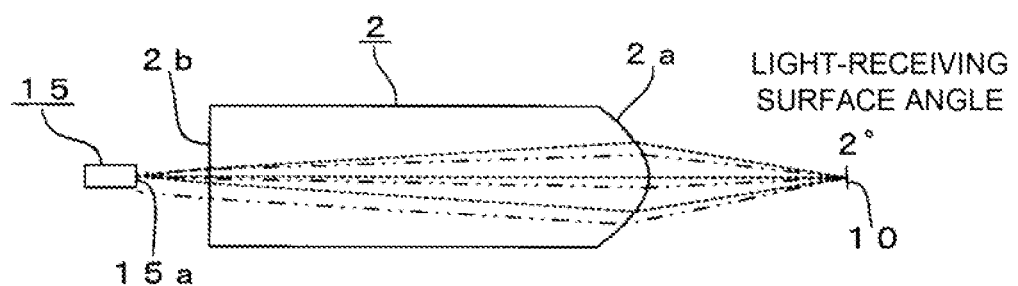
FIG. 3 is a schematic diagram of an optical path for fiber light in an instance in which the tilt of a light-receiving surface of a light-receiving element is 2° in the optical module according to the first embodiment of the present invention.
Figure 4:
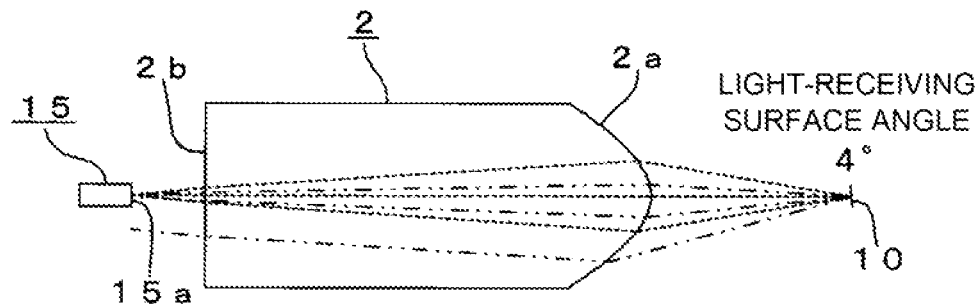
FIG. 4 is a schematic diagram of an optical path for fiber light in an instance in which the tilt of the light-receiving surface of the light-receiving element is 4° in the optical module according to the first embodiment of the present invention.
Figure 5:
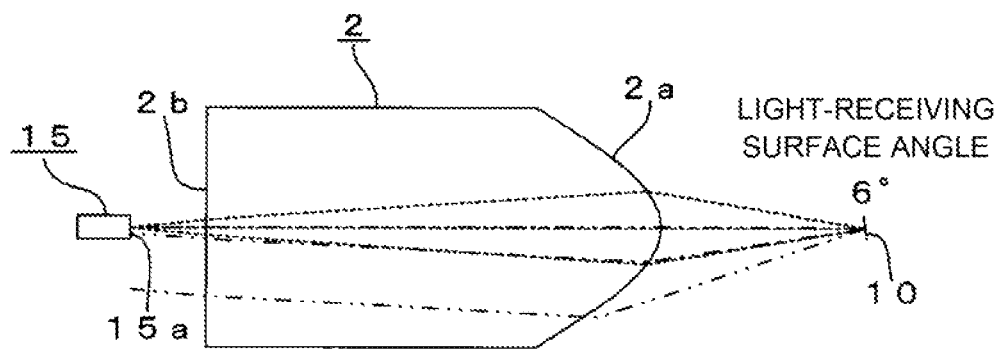
FIG. 5 is a schematic diagram of an optical path for fiber light in an instance in which the tilt of the light-receiving surface of the light-receiving element is 6° in the optical module according to the first embodiment of the present invention.
Figure 6:
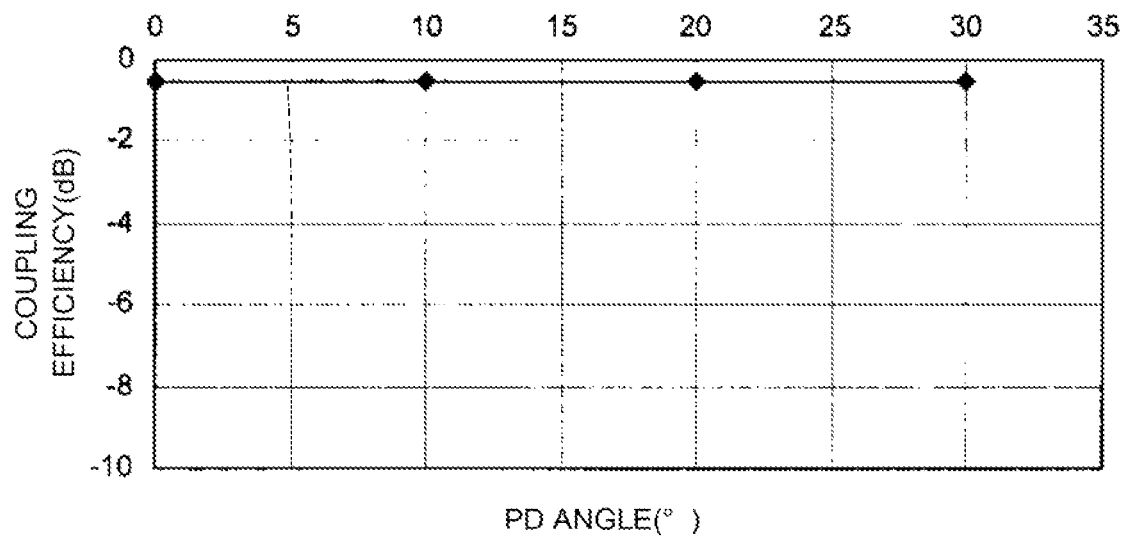
FIG. 6 is a graph showing simulation results for a correlation between the tilt of the light-receiving surface of the light-receiving element and optical coupling efficiency in the optical module according to the first embodiment of the present invention.

Here, in FIG. 3 to FIG. 5, the optical path of the emitted light from the end portion 15a of the optical fiber 15 in instances in which the tilt of the light-receiving surface of the light-receiving element 10 in relation to the virtual plane S that is perpendicular to the optical axis OA of the lens 2 (in other words, the tilt of the contact surface 3a') is respectively 2°, 4°, and 6° are shown. The broken lines in FIG. 3 to FIG. 5 indicate the emitted light from the end portion 15a of the optical fiber 15 (before reaching the light-receiving surface of the light-receiving element 10). In addition, the double-dotted dashed lines in FIG. 3 to FIG. 5 indicate the reflected light of the emitted light at the light-receiving surface of the light-receiving element 10. As shown in FIG. 3 to FIG. 5, it can be said that, to reduce optical feedback, the tilt of the light-receiving surface of the light-receiving element 10 is preferably large. However, on the other hand, deterioration of coupling efficiency of the light to the light-receiving surface caused by the tilt of the light-receiving surface is not desirable. Regarding this point, in the configuration according to the present embodiment, simulation results such as those shown in FIG. 6 can be obtained when simulation is performed for the correlation between the tilt of the light-receiving surface of the light-receiving element 10 and optical coupling efficiency. The horizontal axis in FIG. 6 indicates the tilt (°) of the light-receiving element of the photodetector as the light-receiving element 10 in relation to the vertical plane S perpendicular to the optical axis OA of the lens 2. The vertical axis indicates the coupling efficiency (dB) of the emitted light from the optical fiber to the light-receiving surface of the photodetector. In addition, in the simulation in FIG. 6, as the optical fiber, that of which NA is 0.14 and the core diameter is 00.01 mm was used. As the photodetector, that of which the light-receiving surface is 00.05 mm was used. As shown in FIG. 6, according to the present embodiment, it is clear that sufficient coupling efficiency (−0.52 dB) can be obtained even when the light-receiving surface is tilted by 30°. Such simulation results are assumed to be obtained because the end portion 15a of the optical fiber and the lens 2 are disposed in a coaxial state.

Figure 13:
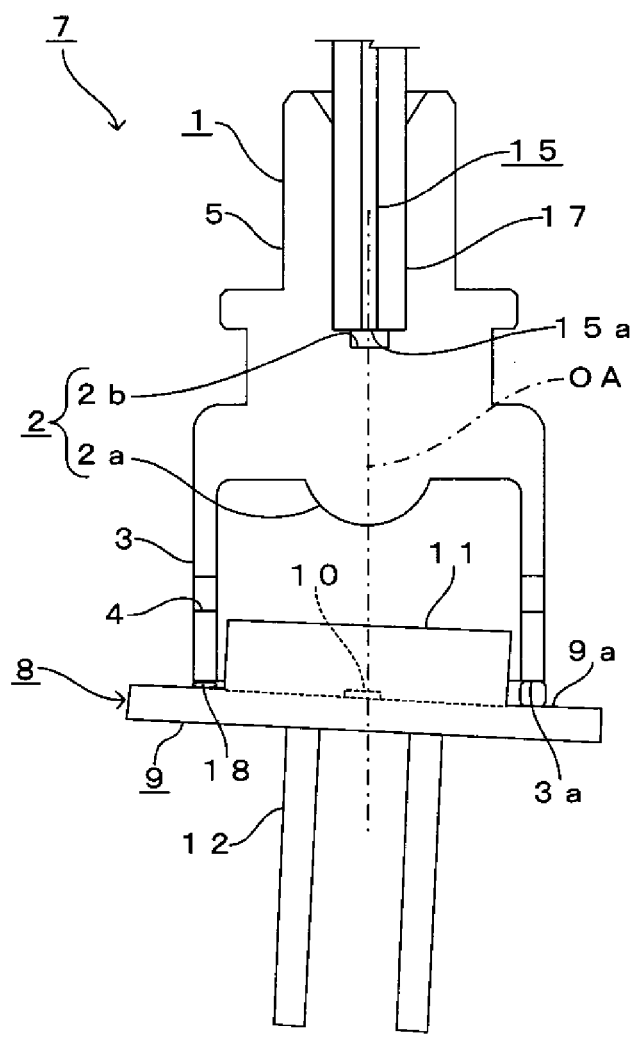
FIG. 13 is a second explanatory diagram for explaining a conventional problem.

In the conventional optical receptacle 1 shown in FIG. 10 as well, generation of optical feedback can be prevented by attachment being performed in a state in which light-receiving surface of the light-receiving element 10 in tilted, as shown in FIG. 13. However, in this instance, attachment of the photoelectric conversion device 8 with high accuracy becomes difficult, as described above.

Therefore, according to the present embodiment, the reflected light on the light-receiving surface of the light-receiving element 10 can be effectively prevented from turning into optical feedback, while using a general-purpose photoelectric conversion device 8. In addition, because the photoelectric conversion device attaching section 3' is concentric with the optical axis OA of the lens 2, integrated molding of the optical receptacle 20 using a resin material can be performed without difficulty. In addition, stability of optical performance against temperature change can be ensured. Furthermore, the photoelectric conversion device 8 can be easily attached with high accuracy as a result of the contact surface 3a' in the photoelectric conversion device attaching section 3' and the contact surface 9a in the photoelectric conversion device 8 being placed in stable contact. Here, as shown in FIG. 6, according to the present embodiment, regarding the tilt of the light-receiving surface of the light-receiving element 10, stability of optical performance can be considered ensured up to a certain degree (at least 30°). However, the simulation results in FIG. 6 are obtained under the premise that the above-described centering operation has been accurately performed. Therefore, an important factor in ensuring optical performance is the highly accurate attachment of the photoelectric conversion device 8 to the intended attachment position in the photoelectric conversion device attaching section 3', upon having placed the contact surfaces 3a and 9a in stable contact with each other with the adhesive 18 therebetween and having performed accurate centering operation. In particular, according to the present embodiment, attachment of the photoelectric conversion device 8 having a larger outer circumference than the photoelectric conversion device attaching section 3' can be appropriately supported.

In addition to the above, in some instances, the optical receptacle 20 according to the present embodiment can be molded using the molding mold of the conventional optical receptacle 1, such as that shown in FIG. 10, on which minor processing has been performed to form the shape transfer surface of the contact surface 3a'. In such instances, further cost reduction can be achieved by utilizing the existing molding mold.

Figure 11:
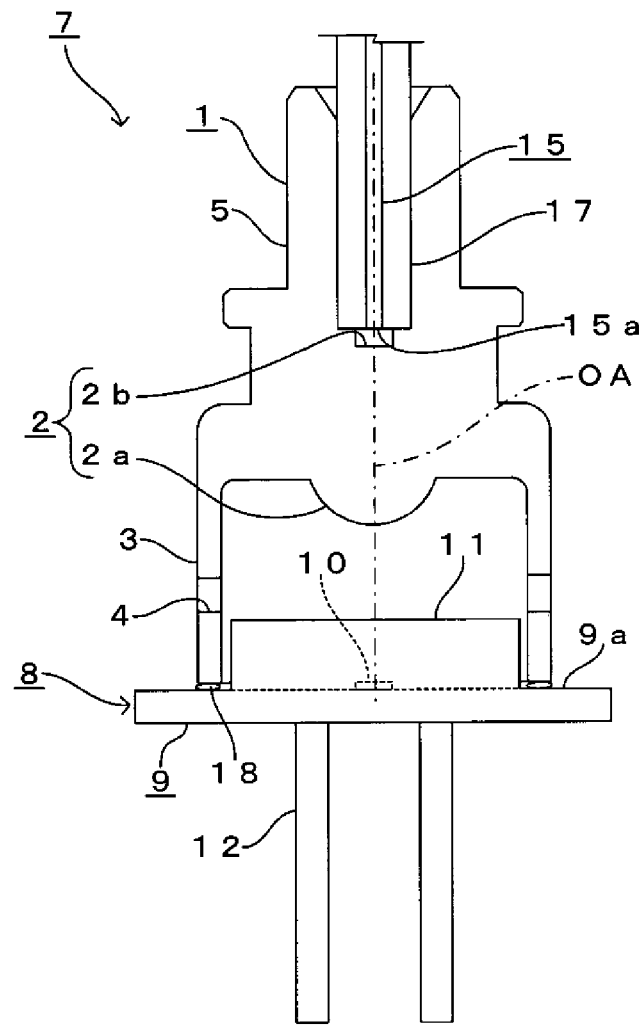
FIG. 11 is a vertical cross-sectional view of a configuration example of a conventional optical module.
Figure 12:
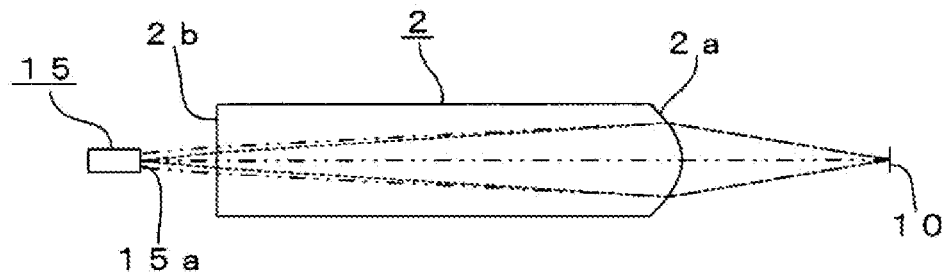
FIG. 12 is a first explanatory diagram for explaining a conventional problem.

Configurations other than those described above are basically similar to those shown in FIG. 10 and FIG. 11. Therefore, detailed descriptions are omitted.

Second Embodiment

Next, a second embodiment of the present invention will be described with reference to FIG. 7 and FIG. 8, focusing mainly on differences with the first embodiment.

Figure 7:
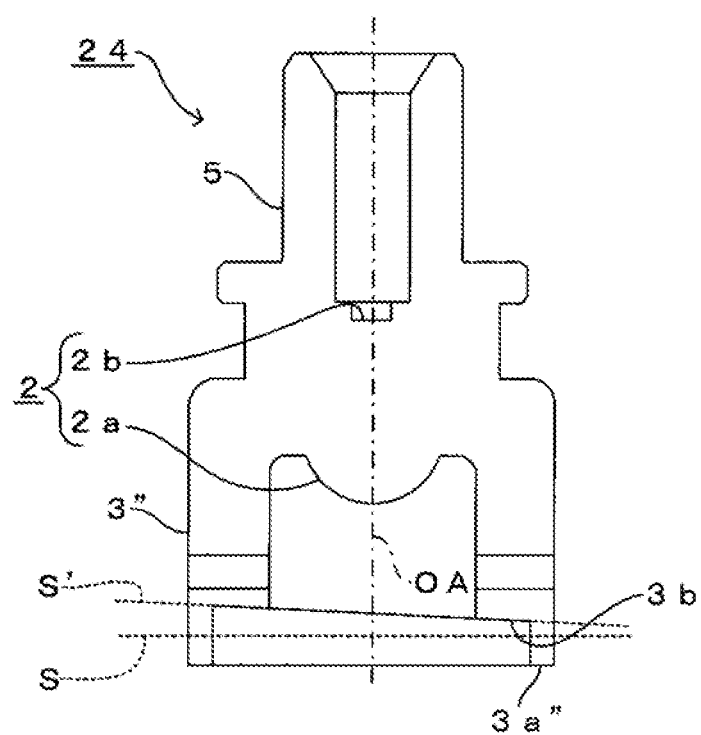
FIG. 7 is a vertical cross-sectional view of an optical receptacle according to a second embodiment of the present invention.

As shown in FIG. 7, an optical receptacle 24 according to the present embodiment is similar to that according to the first embodiment in that a contact surface for the photoelectric conversion device 8 in a photoelectric conversion device attaching section 3" has a tilt in relation to the virtual plane S perpendicular to the optical axis OA of the lens 2.

However, according to the present embodiment, as shown in FIG. 7, the contact surface in the photoelectric conversion device attaching section 3" is not a lower end surface 3a" of the photoelectric conversion device attaching section 3", but rather, a recessing surface 3b that recesses towards the lens 2 side in relation to the lower end surface 3a" in a position further inward in the radial direction than the lower end surface 3a".

Figure 8:
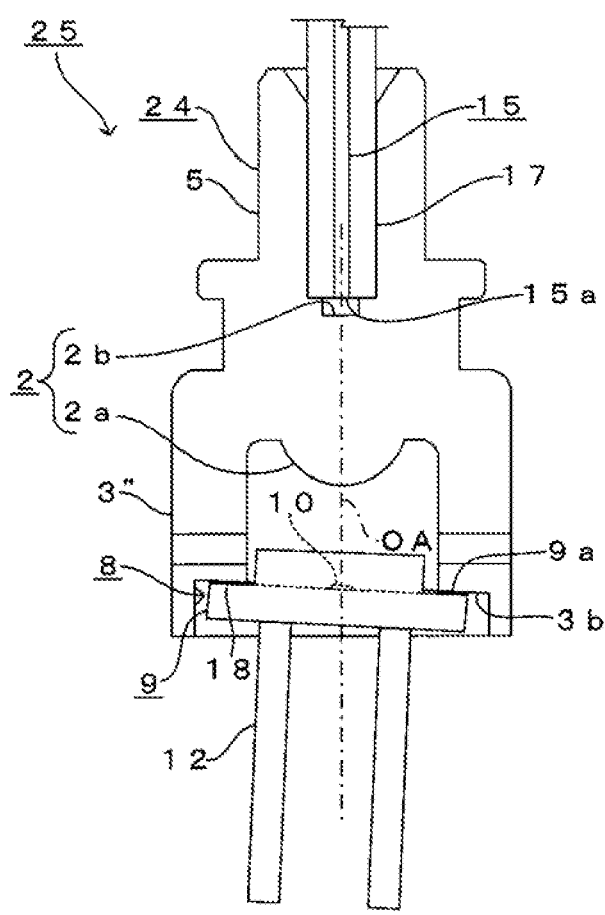
FIG. 8 is a vertical cross-sectional view of an optical module according to the second embodiment of the present invention.

FIG. 8 shows an optical module 25 including the optical receptacle 24 according to the present embodiment, such as that described above.

As shown in FIG. 8, according to the present embodiment as well, the photoelectric conversion device 8 can be easily and stably attached to the photoelectric conversion device attaching section 3" in a state in which the contact surface 3b in the photoelectric conversion device attaching section 3" and the contact surface 9a in the photoelectric conversion device 8 are in contact with each other. Therefore, the light-receiving surface of the light-receiving element 10 can be tilted in relation to the lens 2.

Therefore, according to the present embodiment as well, working effects similar to those according to the first embodiment can be achieved. In particular, according to the present embodiment, attachment of the photoelectric conversion device 8 having a smaller outer circumference than the photoelectric conversion device attaching section 3" can be appropriately supported.

The present invention is not limited to the above-described embodiments and may be variously modified to the extent that features thereof are not compromised.

Figure 9:
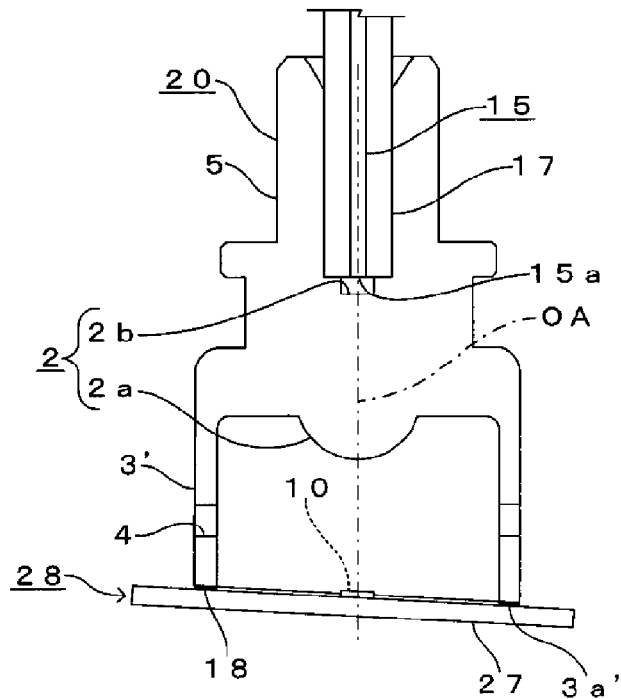
FIG. 9 is a vertical cross-sectional view of a variation example of the optical module.

For example, the present invention is not limited to the CAN-package-type photoelectric conversion device 8, and can also be effectively applied to a substrate-mounted photoelectric conversion device 28 in which the light-receiving element 10 is mounted on a surface of a semiconductor substrate 27, as shown in FIG. 9.

EXPLANATIONS OF LETTERS OR NUMERALS 2 lens
3' photoelectric conversion device attaching section
5 optical fiber attaching section
8 photoelectric conversion device
15 optical fiber

The invention claimed is:

1. An optical receptacle comprising:
a cylindrical optical fiber-attaching section for attaching an end portion of an optical fiber;
a cylindrical photoelectric conversion device-attaching section for attaching, in a state of contact, a photoelectric conversion device having a light-receiving element; and
a lens for optically coupling the end portion of the optical fiber and the light-receiving element, wherein
the optical fiber-attaching section, the photoelectric conversion device-attaching section, and the lens are integrally formed by a light-transmitting resin material,
the optical fiber-attaching section and the photoelectric conversion device-attaching section are formed concentrically with an optical axis of the lens,
a contact surface for the photoelectric conversion device in the photoelectric conversion device-attaching section is tilted at a tilt angle of 30 degrees or less in relation to a plane that is perpendicular to the optical axis of the lens, and
the photoelectric conversion device is attached to the photoelectric conversion device-attaching section in which a contact surface for the photoelectric conversion device-attaching section is formed in parallel with a light-receiving surface of the light-receiving element, and the contact surface for the photoelectric conversion device in the photoelectric conversion device-attaching section is in contact with the contact surface for the photoelectric conversion device-attaching section in the photoelectric conversion device and is positioned entirely co-axially with the optical axis of the lens so that coupling efficiency of light transmitted to the light-receiving surface of the light-receiving element can be −0.52 dB as measured when the tilt angle of the contact surface for the photoelectric conversion device is 30 degrees or less.

2. The optical receptacle according to claim 1, wherein:
the contact surface for the photoelectric conversion device in the photoelectric conversion device-attaching section is an end surface of the photoelectric conversion device-attaching section on the photoelectric conversion device side.

3. An optical module comprising:
an optical receptacle according to claim 2;
an optical fiber, an end portion of which is attached to the cylindrical optical fiber-attaching section of the optical receptacle; and
a photoelectric conversion device having a light-receiving element, which photoelectric conversion device is attached, in a state of contact, to the cylindrical photoelectric conversion device-attaching section of the optical receptacle.

4. The optical module according to claim 3, wherein:
the optical fiber is a single-mode optical fiber.

5. The optical receptacle according to claim 1, wherein:
the contact surface for the photoelectric conversion device in the photoelectric conversion device-attaching section is a surface recessed relative to the end surface of the photoelectric conversion device-attaching section on the photoelectric conversion device side, in a position further inward in a radial direction than the end surface.

6. An optical module comprising:
an optical receptacle according to claim 5;
an optical fiber, an end portion of which is attached to the cylindrical optical fiber-attaching section of the optical receptacle; and
a photoelectric conversion device having a light-receiving element, which photoelectric conversion device is attached, in a state of contact, to the cylindrical photoelectric conversion device-attaching section of the optical receptacle.

7. The optical module according to claim 6, wherein:
the optical fiber is a single-mode optical fiber.

8. An optical module comprising:
an optical receptacle according to claim 1;
an optical fiber, an end portion of which is attached to the cylindrical optical fiber-attaching section of the optical receptacle; and
a photoelectric conversion having a light-receiving element, which photoelectric conversion device is attached, in a state of contact, to the cylindrical photoelectric conversion device-attaching section of the optical receptacle.

9. The optical module according to claim 8, wherein:
the optical fiber is a single-mode optical fiber.

* * * * *

UNITED STATES PATENT AND TRADEMARK OFFICE
CERTIFICATE OF CORRECTION

| | |
|---|---|
| PATENT NO. | : 9,291,783 B2 |
| APPLICATION NO. | : 14/122232 |
| DATED | : March 22, 2016 |
| INVENTOR(S) | : Kazutaka Shibuya |

It is certified that error appears in the above-identified patent and that said Letters Patent is hereby corrected as shown below:

On the title page, at (87), at PCT Pub. Date:, please delete "Dec. 3, 2012" and insert therefor
--Dec. 13, 2012--.

Signed and Sealed this
Fifth Day of July, 2016

Michelle K. Lee
*Director of the United States Patent and Trademark Office*